(12) United States Patent
Zhou et al.

(10) Patent No.: US 7,851,809 B2
(45) Date of Patent: Dec. 14, 2010

(54) MULTI-CHIP ASSEMBLY WITH OPTICALLY COUPLED DIE

(75) Inventors: Qing A. Zhou, Chandler, AZ (US); Daoqiang Lu, Chandler, AZ (US); Jiangqi He, Gilbert, AZ (US); Wei Shi, Gilbert, AZ (US); Xiang Yin Zeng, Shanghai (CN)

(73) Assignee: Intel Corporation, Santa Clara, CA (US)

( * ) Notice: Subject to any disclaimer, the term of this patent is extended or adjusted under 35 U.S.C. 154(b) by 42 days.

(21) Appl. No.: 12/456,224

(22) Filed: Jun. 12, 2009

(65) Prior Publication Data

US 2009/0250707 A1 Oct. 8, 2009

Related U.S. Application Data

(63) Continuation of application No. 11/270,271, filed on Nov. 9, 2005, now Pat. No. 7,564,066.

(51) Int. Cl.
*H01L 31/147* (2006.01)
(52) U.S. Cl. .................. 257/81; 257/80; 257/E33.076; 257/E33.077; 257/E31.096
(58) Field of Classification Search ............. 257/80–81, 257/E33.076, E33.077, E31.096
See application file for complete search history.

(56) References Cited

U.S. PATENT DOCUMENTS

| 3,727,064 | A | * | 4/1973 | Bottini | 250/551 |
|---|---|---|---|---|---|
| 5,101,099 | A | * | 3/1992 | Funada et al. | 250/208.1 |
| 5,245,198 | A | | 9/1993 | Kusuda et al. | |
| 5,545,893 | A | * | 8/1996 | Brown et al. | 250/239 |
| 5,627,364 | A | | 5/1997 | Codama et al. | |
| 5,629,533 | A | | 5/1997 | Ackley et al. | |
| 6,674,061 | B1 | * | 1/2004 | Arimoto | 250/208.1 |
| 7,038,316 | B2 | | 5/2006 | Hu et al. | |
| 7,230,309 | B2 | | 6/2007 | Bauer et al. | |
| 7,659,531 | B2 | * | 2/2010 | Choi et al. | 250/551 |
| 2006/0138434 | A1 | * | 6/2006 | Summers | 257/84 |
| 2010/0027577 | A1 | * | 2/2010 | Dutta | 372/50.1 |

FOREIGN PATENT DOCUMENTS

| EP | 0461302 A2 | | 12/1991 |
|---|---|---|---|
| GB | 2152749 A | * | 8/1985 |

* cited by examiner

*Primary Examiner*—Allan R Wilson
(74) *Attorney, Agent, or Firm*—Kerry D. Tweet

(57) ABSTRACT

Disclosed are embodiments of a multi-chip assembly including optically coupled die. The multi-chip assembly may include two opposing substrates, and a number of die are mounted on each of the substrates. At least one die on one of the substrates is in optical communication with at least one opposing die on the other substrate. Other embodiments are described and claimed.

5 Claims, 5 Drawing Sheets

MULTI-CHIP ASSEMBLY WITH OPTICALLY COUPLED DIE

CLAIM OF PRIORITY

This application is a continuation of U.S. patent application Ser. No. 11/270,271, filed Nov. 9, 2005, now U.S. Pat. No. 7,564,066.

FIELD OF THE INVENTION

The disclosed embodiments relate generally to the manufacture of integrated circuit devices and, more particularly, to a multi-chip assembly including opposing die that communicate through the exchange of optical signals.

BACKGROUND OF THE INVENTION

As manufacturers of integrated circuit devices, electronic devices, and computing systems strive to reduce package form factors and size, while also improving performance and offering enhanced features, these manufacturers may turn to multi-chip packages. A multi-chip package may comprise an assembly including multiple integrated circuit die—as well as other components, such as discrete passives, etc.— mounted on a common substrate or board. Such a multi-chip package may include any number and combination of integrated circuit devices, such as processing devices, memory devices, wireless communication devices, etc. In these multi-chip packages, die-to-die communications may limit speed and performance, as long communication paths (e.g., conductors within the substrate) may exist between any two die which need to communicate with one another. Some solutions to improve the speed of die-to-die communications in multi-chip packages have been proposed, including the use of high speed flex substrates and the use of optical waveguides.

DETAILED DESCRIPTION OF THE INVENTION

Figure 1A:
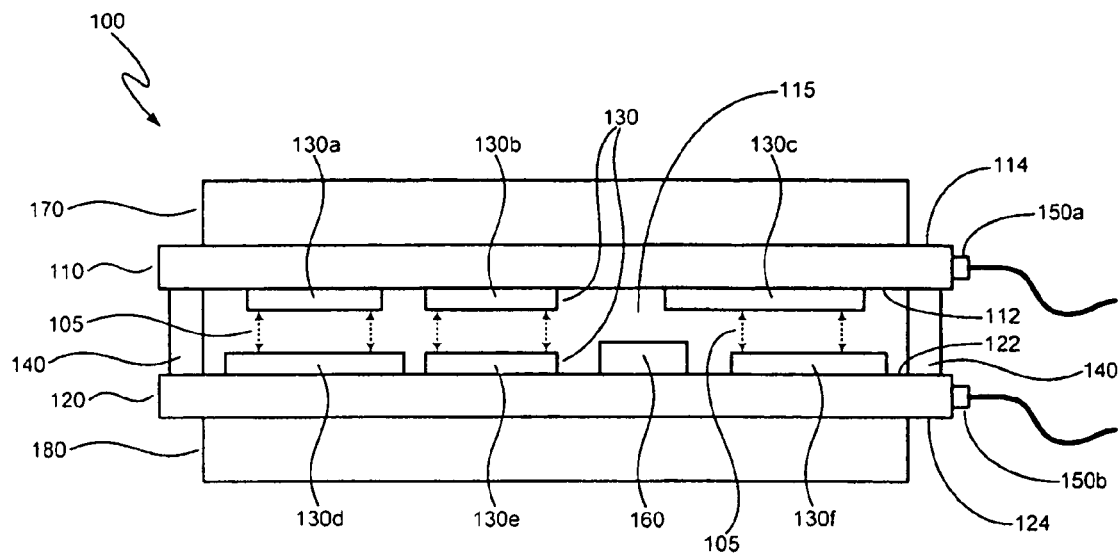
FIGS. 1A-1B are schematic diagrams illustrating embodiments of a multi-chip assembly having optically coupled die.

Referring to FIG. 1A, illustrated is an embodiment of a multi-chip package 100. The multi-chip package 100 includes a plurality of die 130 mounted on two opposing substrates 110, 120. At least two opposing die 130 on the substrates 110, 120, respectively, are capable of communicating through the exchange of optical signals. Optically coupling at least some of the die 130 may provide high speed die-to-die communications within multi-chip package 100.

As noted above, the multi-chip package 100 includes a pair of opposing substrates, including a first substrate 110 and a second substrate 120. The first substrate 110 includes an interior surface 112 and an opposing surface 114. Similarly, the second substrate 120 includes an interior surface 122 and an opposing surface 124. The interior surface 112 of first substrate 110 faces the interior surface 122 of second substrate 120, wherein a cavity or gap 115 exists between these two opposing substrate surfaces. Each of the substrates 110, 120 may comprise any suitable material or combination of materials. In one embodiment, a substrate 110, 120 may comprise silicon, and in another embodiment a substrate 110, 120 may comprise a ceramic material. In a further embodiment, a substrate 110, 120 may comprise an organic material. According to another embodiment, a substrate 110, 120 may comprise multiple levels of metallization (e.g., a number of conductive traces) separated from one another by intervening layers of a dielectric material and interconnected by vias, wherein the alternating layers of metallization and dielectric material may be built up over a core layer of dielectric material (or perhaps a metal core). In yet a further embodiment, the substrates 110, 120 may comprise a thermally conductive material. The first and second substrates 110, 120 may comprise the same material or, in other embodiments, these two substrates may comprise different materials.

The first and second substrates 110, 120 may be mechanically coupled to one another using any suitable device(s) or technique. For example, the substrates 110, 120 may be interconnected using adhesives (e.g., epoxies) and/or mechanical fasteners (e.g., spring clips, screws, bolts, etc.). To maintain the desired separation between the spaced-apart surfaces 112, 122 of the first and second substrates 110, 120, respectively, one or more spacers 140 may be disposed between these two substrates. Also, the desired alignment in the lateral plane may be achieved using any suitable alignment device(s) or method (e.g., registration marks, alignment pins or other registration features, etc.).

A number of die 130 are mounted on the interior surfaces 112, 122 of the substrates 110, 120, as was also noted above. For example, a number of die 130a, 130b, 130c may be disposed on the interior surface 112 of first substrate 110, and a number of die 130d, 130e, 130f may be disposed on the interior surface 122 of second substrate 120. Each die 130 may be mechanically and electrically coupled with one of the substrates 110, 120 using any suitable method, and embodiments of the manner in which a die 130 may be coupled to one of the substrates are described with respect to FIGS. 3A through 3C and the accompanying text below. In some embodiments, a die 130 may be mechanically coupled to one of the substrates 110, 120, but not electrically coupled with this substrate (although in one embodiment—see FIG. 3B—the die may be electrically coupled with the opposing substrate).

Any suitable type and combination of die 130 may be disposed on each of the substrates 110, 120, and each substrate may have any desired number of die (e.g., one or more). For example, a die 130 may comprise a processing device, such as a microprocessor, a network processor, an application specific integrated circuit (ASIC), a field programmable gate array (FPGA), etc. Alternatively, a die 130 may comprise a memory device, such as a static random access memory (SRAM), a dynamic random access memory (DRAM), a synchronous DRAM (SDRAM), a double data rate DRAM (DDRDRAM), a flash memory, etc. In other embodiments, a die 130 may comprise a wireless communication device, a graphics processor, a network interface device, or a chip set, as well as any other type of integrated circuit device. Any combination of die 130 may be disposed in the multi-chip package 100. For example, the multi-chip package may include one or more processing devices in combination with one or more memory devices, as well as other types of integrated circuit devices. Also, the number of die 130 on the first and second substrates 110, 120 does not need to be equal, although in some embodiments these substrates may have the same number of die.

Figure 1B:
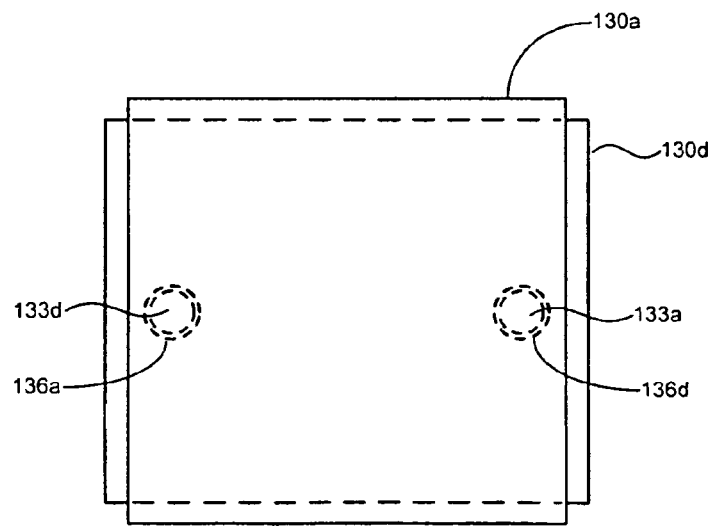

As noted at the outset, at least one die 130 on the first substrate 110 is optically coupled with at least one die 130 on the second substrate 120. The exchange of optical signals is represented schematically in FIG. 1A by arrows 105. By way of example, the die 130a on first substrate 110 is optically coupled with the die 130d on second substrate 120. In one embodiment, each die in a pair of optically coupled die includes at least one emitter and one receiver, as illustrated in FIG. 1B, which shows the optically coupled die 130a, 130d. With reference to this figure, die 130a includes an emitter 133a and a receiver 136a, whereas die 130d includes an emitter 133d and a receiver 136d. The emitter 133a on die 130a is aligned with the receiver 136d on die 130d, and the emitter 133d on die 130d is aligned with the receiver 136a on die 130a. Thus, the opposing die 130a, 130d are capable of communicating with each other by the exchange of optical signals.

To communicate with one another, each of the die 130a, 130d may include any suitable number of emitters and receivers. For example, as shown in FIG. 1B, each die 130a, 130d may include a single emitter and a single receiver. However, in other embodiments, each die in a pair of optically coupled die may include multiple emitters and receivers. For example, the die 130a may include an array of emitters communicatively coupled with a corresponding array of receivers on die 130d, and likewise die 130d may include an array of emitters communicatively coupled with a corresponding array of receivers on die 130a. Also, in the embodiments of FIGS. 1A and 1B, a die 130 on first substrate 110 is optically coupled with a single die 130 on second substrate 120. However, in other embodiments a die on one substrate may be optically coupled with two or more die on the opposing substrate, and such an embodiment is described below in FIGS. 2A through 2C and the accompanying text.

An emitter (e.g., the emitters 133a, 133d on die 130a, 130d, respectively) may comprise any suitable laser or other light source. In one embodiment, an emitter comprises a vertical cavity surface emitting laser (VCSEL), which are routinely fabricated in arrays on a single chip. In another embodiment, an emitter comprises an edge emitting laser. According to one embodiment, an emitter (or emitters) is formed directly on a die 130; however, in other embodiments, an emitter (or emitters) may be fabricated on a separate substrate or chip and then subsequently attached to one of the die 130. In a further embodiment, the drive circuitry associated with an emitter may be formed directly upon the die 130 on which the emitter is located. In an alternative embodiment, the drive circuitry associated with an emitter may be located off-chip.

A receiver (e.g., the receivers 136a, 136d on die 130a, 130d, respectively) may comprise any suitable type of photodetector. In one embodiment, a receiver (or receivers) is formed directly on a die 130. However, in other embodiments, a receiver (or receivers) may be fabricated on a separate substrate or chip and then subsequently attached to one of the die 130. Also, the circuitry associated with a receiver (e.g., a transimpedance amplifier, or TIA, as well as other circuitry) may be formed directly upon the die on which the receiver is located, or alternatively this circuitry may be located off-chip.

At this juncture, it should be noted that, as used herein, the phrase "optically coupled" suggests the ability of one die to transmit an optical signal and another die to receive that optical signal. Although, in one embodiment a die may have the ability to both transmit and receive optical signals, in other embodiments a die may not have the ability to both transmit and receive optical signals (e.g., the die may be able to transmit optical signals or the die may be able to receive optical signals, but not perform both functions). Further, use of the term "optically coupled" should not limit the ability of two die to be communicatively coupled by other methods (e.g., electrically coupled, wirelessly coupled, etc.). Also, there may be two or more die within multi-chip package 100 that are not optically coupled, but otherwise communicate with one another (e.g., by electrical interconnections, by a wireless connection, etc.). Also, although the disclosed embodiments are described in the context of the exchange of optical signals using lasers or other light sources, it should be understood that any two die 130 in multi-chip package 100 may be communicatively coupled using any source of detectable emissions (e.g., ions, electrons, various forms of radiation, etc.).

Returning to FIG. 1A, any suitable device or technique may be employed to deliver power to the multi-chip package 100. In one embodiment, as shown in FIG. 1A, each of the substrates 110, 120 includes a power connector 150a, 150b, respectively, to electrically couple that substrate with an external power source. In another embodiment, one of the substrates (e.g., substrate 110) may include a power connector to electrically couple the multi-chip package 100 with an external power source and, in turn, that substrate may be electrically coupled (e.g., as by a flex substrate having a number of conductors) with the other substrate (e.g., substrate 120) to distribute power. In a further embodiment, as shown below in FIG. 2A, a single integrated power connector may deliver power to both the first and second substrates 110, 120.

According to one embodiment, in addition to die 130, other devices may be mounted on either one or both of the substrates 110, 120. For example, one or more passive components 160 (e.g., a capacitor, resistor, inductor, etc.) may be mounted on one or both of the substrates 110, 120. Other devices that may be disposed in multi-chip package 100 include antennas, sockets, other signal lines and buses, etc.

According to another embodiment, a thermal component is coupled with one or both of the first and second substrates 110, 120. For example, a thermal component 170 may be thermally coupled with first substrate 110, and a thermal component 180 may be thermally coupled with second substrate 120. Each of the thermal components 170, 180 may comprise any suitable device capable of removing heat from the mating substrate and dissipating that heat to the surrounding environment. For example, a thermal component 170, 180 may comprise a heat spreader (e.g., a copper plate), a heat sink (e.g., a multi-fin heat sink), or an active cooling system (e.g., a fluid cooling system), as well as any combination of passive and active cooling devices. The thermal components 170, 180 may be thermally coupled to their respective substrates 110, 120 by any suitable method or technique (e.g., by a layer of thermally conductive adhesive, by a layer of thermal grease, by a layer of solder material that is reflowed to form a bond, by mechanical fasteners such as spring clips, etc.).

Figure 2A:
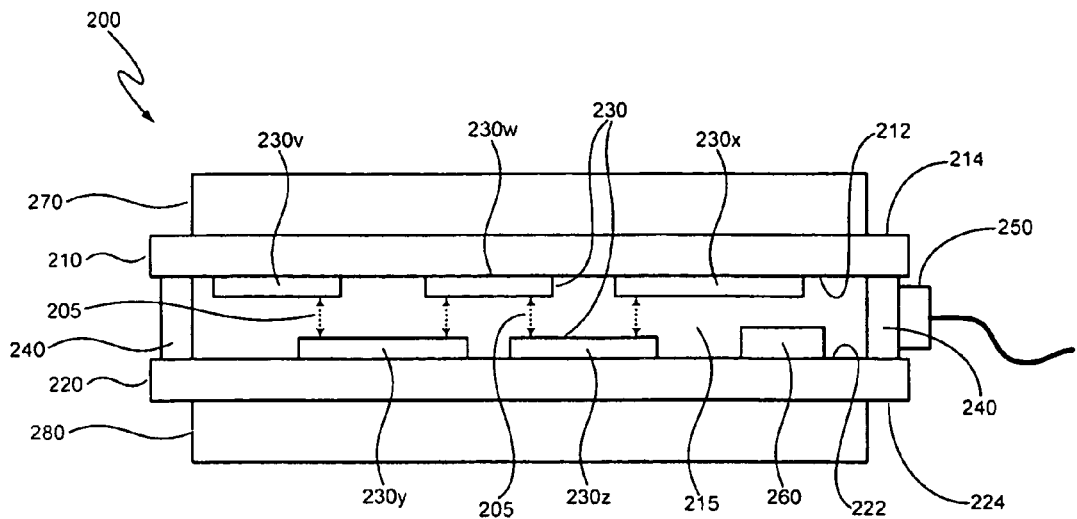
FIGS. 2A-2C are schematic diagrams illustrating further embodiments of a multi-chip assembly having optically coupled die.
Figure 2B:
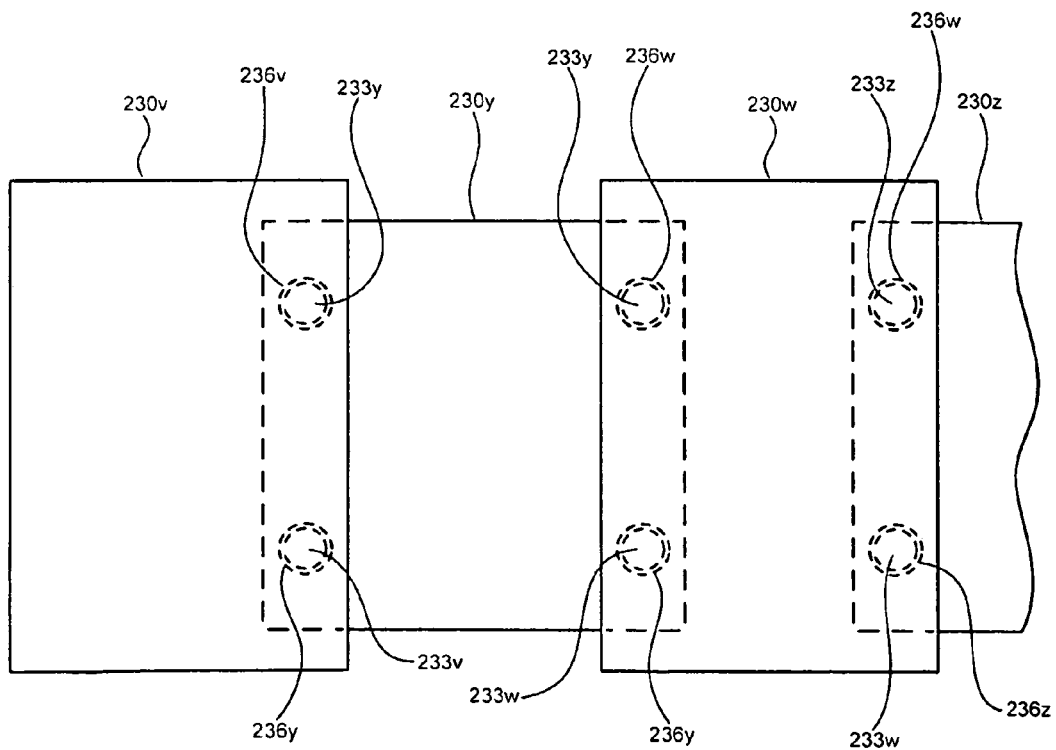
Figure 2C:
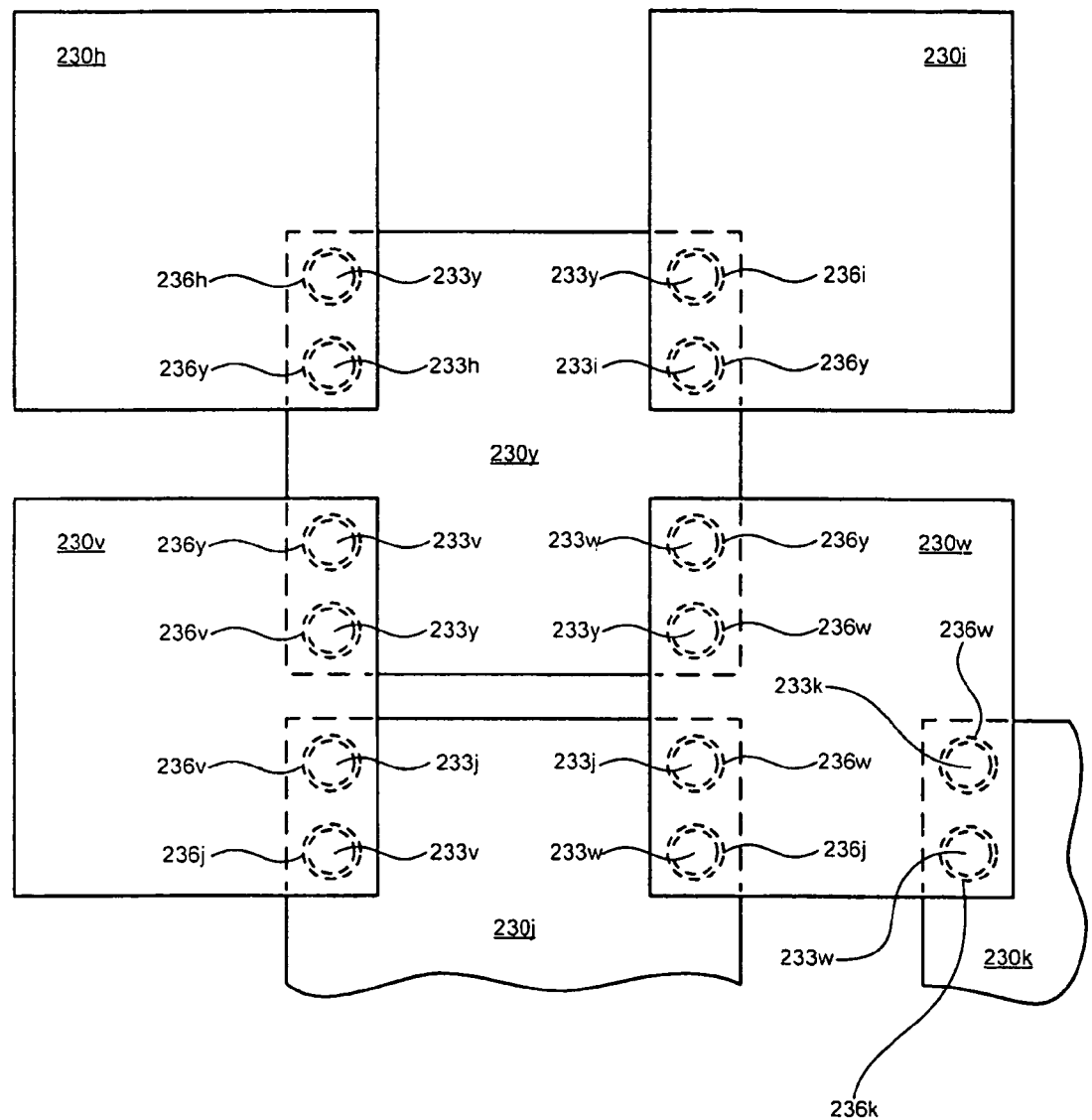

Turning now to FIGS. 2A through 2C, illustrated is another embodiment of a multi-chip package 200 having optically coupled die. The multi-chip package 200 includes a pair of opposing substrates, including a first substrate 210 and a second substrate 220. The first substrate 210 includes an interior surface 212 and an opposing surface 214, whereas the second substrate 220 includes an interior surface 222 and an opposing surface 224. The interior surface 212 of first substrate 210 faces the interior surface 222 of second substrate 220, wherein a cavity or gap 215 exists between these two opposing substrate surfaces.

Each of the substrates 210, 220 may comprise any suitable material or combination of materials. In one embodiment, a substrate 210, 220 may comprise silicon, and in another embodiment a substrate 210, 220 may comprise a ceramic material. In a further embodiment, a substrate 210, 220 may comprise an organic material. According to another embodiment, a substrate 210, 220 may comprise multiple levels of metallization (e.g., a number of conductive traces) separated from one another by intervening layers of a dielectric material and interconnected by vias, wherein the alternating layers of metallization and dielectric material may be built up over a core layer of dielectric material (or perhaps a metal core). In yet a further embodiment, the substrates 210, 220 may comprise a thermally conductive material. The first and second substrates 210, 220 may comprise the same material or, in other embodiments, these two substrates may comprise different materials.

The first and second substrate 210, 220 may be mechanically coupled to one another using any suitable device(s) or technique. For example, the substrates 210, 220 may be interconnected using adhesives (e.g., epoxies) and/or mechanical fasteners (e.g., spring clips, screws, bolts, etc.). To maintain the desired separation between the spaced-apart surfaces 212, 222 of the first and second substrates 210, 220, respectively, one or more spacers 240 may be disposed between these two substrates. Also, the desired alignment in the lateral plane may be achieved using any suitable alignment device(s) or method (e.g., registration marks, alignment pins or other registration features, etc.).

A number of die 230 are mounted on the interior surfaces 212, 222 of the substrates 210, 220. For example, a number of die $230v$, $230w$, $230x$ may be disposed on the interior surface 212 of first substrate 210, and a number of die $230y$, $230z$ may be disposed on the interior surface 222 of second substrate 220. Each die 230 may be mechanically and electrically coupled with one of the substrates 210, 220 using any suitable method. As previously noted, embodiments of the manner in which a die 230 may be coupled to one of the substrates are described with respect to FIGS. 3A through 3C and the accompanying text below. In some embodiments, a die 230 may be mechanically coupled to one of the substrates 210, 220, but not electrically coupled with this substrate (although in one embodiment—see FIG. 3B—the die may be electrically coupled with the opposing substrate).

Any suitable type and combination of die 230 may be disposed on each of the substrates 210, 220, and each substrate may have any desired number of die (e.g., one or more). For example, a die 230 may comprise a processing device, such as a microprocessor, a network processor, an ASIC, an FPGA, etc. Alternatively, a die 230 may comprise a memory device, such as a SRAM, a DRAM, a SDRAM, a DDRDRAM, a flash memory, etc. In other embodiments, a die 230 may comprise a wireless communication device, a graphics processor, a network interface device, or a chip set, as well as any other type of integrated circuit device. Any combination of die 230 may be disposed in the multi-chip package 200. For example, the multi-chip package may include one or more processing devices in combination with one or more memory devices, as well as other types of integrated circuit devices. Also, the number of die 230 on the first and second substrates 210, 220 does not need to be equal, although in some embodiments these substrates may have the same number of die.

In one embodiment, at least one die 230 on one of the substrates 210, 220 is optically coupled with two or more die 230 on the other substrate. The exchange of optical signals is represented schematically in FIG. 2A by arrows 205. By way of example, the die $230y$ on second substrate 220 is optically coupled with each of the die $230v$, $230w$ on first substrate 210. In one embodiment, a die 230 includes at least one emitter and one receiver for each other die that it is optically coupled with. This is illustrated, by way of example, in FIG. 2B, which shows the optically coupled die $230v$, $230y$, $230w$ (and $230z$). With reference to FIG. 2B, the die $230y$ includes two emitters $233y$ and two receivers $236y$. One of the emitters $233y$ and one of the receivers $236y$ are aligned with a receiver $236v$ and an emitter $233v$, respectively, on the die $230v$ located on first substrate 210. Similarly, the other emitter $233y$ and the other receiver $236y$ on die $230y$ are aligned with a receiver $236w$ and an emitter $233w$, respectively, on the die $230w$, which is also on first substrate 210. Thus, the die $230y$ is capable of exchanging optical signals with both of the die $230v$, $230w$. Further, the die $230w$ on first substrate 210 is also optically coupled with another die $230z$ on second substrate 220, which is also shown in FIG. 2B, where the emitter-receiver pairs $233w$, $236z$ and $233z$, $236w$ are in alignment and capable of optical communication. Other die 230 in multi-chip package 200 may also be in optical communication (e.g., the die $230x$, $230z$, etc.).

To communicate with one another, each of the die $230v$, $230y$, $230w$ may include any suitable number of emitters and receivers. For example, as shown in FIG. 2B, each die 230 includes at least one emitter and receiver for each other die to which it is optically coupled (e.g., in this embodiment, die $230y$ includes two emitters and two receivers, as this die is optically coupled with two other die). However, in other embodiments, a die may include multiple emitters and receivers for each die to which it is optically coupled. For example, the die $230y$ may include an array of emitters communicatively coupled with a corresponding array of receivers on die $230v$, and die $230y$ may also include an array of receivers communicatively coupled with a corresponding array of emitters on die $230v$. Similarly, the die $230y$ may include an array of emitters communicatively coupled with a corresponding array of receivers on die $230w$, and die $230y$ may also include an array of receivers communicatively coupled with a corresponding array of emitters on die $230w$.

Of course, it should be understood that a die may be optically coupled with any suitable number of other die (e.g., more than two). This is illustrated, by way of example, in FIG. 2C, which shows the die $230v$, $230y$, $230w$ communicatively coupled, as described above (in a different configuration). However, in the embodiment of FIG. 2C, four additional die are disposed in the multi-chip package 200, including die $230h$, $230i$ on first substrate 210 and die $230j$, $230k$ on second substrate 220. The die $230v$ includes emitters $233v$ and receivers $236v$, the die $230y$ includes emitters $233y$ and receivers $236y$, the die $230w$ includes emitters $233w$ and receivers $236w$, the die $230h$ includes emitters $233h$ and receivers $236h$, the die $230i$ includes emitters $233i$ and receivers $236i$, the die $230j$ includes emitters $233j$ and receivers $236j$, and the die $230k$ includes emitters $233k$ and receivers $236k$. In the illustrated example, die $230y$ is optically coupled with four other die (e.g., die $230h$, $230i$, $230v$, and $230w$), and die $230w$ is optically coupled with three other die (e.g., die $230y$, $230j$, and $230k$).

As previously described, an emitter may comprise any suitable laser or other light source. In one embodiment, an emitter comprises a VCSEL, and in another embodiment an emitter comprises an edge emitting laser. According to one embodiment, an emitter (or emitters) is formed directly on a die 230; however, in other embodiments, an emitter (or emitters) may be fabricated on a separate substrate or chip and then subsequently attached to one of the die 230. In a further embodiment, the drive circuitry associated with an emitter may be formed directly upon the die 230 on which the emitter is located. In an alternative embodiment, the drive circuitry associated with an emitter may be located off-chip.

As was also previously described, a receiver may comprise any suitable type of photodetector. In one embodiment, a receiver (or receivers) is formed directly on a die 230. However, in other embodiments, a receiver (or receivers) may be fabricated on a separate substrate or chip and then subsequently attached to one of the die 230. Also, the circuitry associated with a receiver (e.g., a TIA, as well as other circuitry) may be formed directly upon the die on which the receiver is located, or alternatively this circuitry may be located off-chip.

Returning to FIG. 2A, any suitable device or technique may be employed to deliver power to the multi-chip package 200. According to one embodiment, as shown in FIG. 2A, the multi-chip package 200 includes a single integrated power connector 250 to electrically couple both of the substrates 210, 220 with an external power source. In one embodiment, the power connector 250 may comprise part of a spacer 240. According to another embodiment, each of the substrates 210, 220 may include a separate power connector to receive power from an external source (e.g., see FIG. 1A). According to a further embodiment, one of the substrates (e.g., substrate 210) may include a power connector to electrically couple the multi-chip package 200 with an external power source, and that substrate may be electrically coupled (e.g., as by a flex substrate having a number of conductors) with the other substrate (e.g., substrate 220) to distribute power.

According to one embodiment, in addition to die 230, other devices may be mounted on either one or both of the substrates 210, 220. For example, one or more passive components 260 (e.g., a capacitor, resistor, inductor, etc.) may be mounted on one or both of the substrates 210, 220. Other devices that may be disposed in multi-chip package 200 include antennas, sockets, other signal lines and buses, etc.

According to another embodiment, a thermal component is coupled with one or both of the first and second substrates 210, 220. For example, a thermal component 270 may be thermally coupled with first substrate 210, and a thermal component 280 may be thermally coupled with second substrate 220. Each of the thermal components 270, 280 may comprise any suitable device capable of removing heat from the mating substrate and dissipating that heat to the surrounding environment. For example, a thermal component 270, 280 may comprise a heat spreader (e.g., a copper plate), a heat sink (e.g., a multi-fin heat sink), or an active cooling system (e.g., a fluid cooling system), as well as any combination of passive and active cooling devices. The thermal components 270, 280 may be thermally coupled to their respective substrates 210, 220 by any suitable method or technique (e.g., by a layer of thermally conductive adhesive, by a layer of thermal grease, by a layer of solder material that is reflowed to form a bond, by mechanical fasteners such as spring clips, etc.).

Figure 3A:
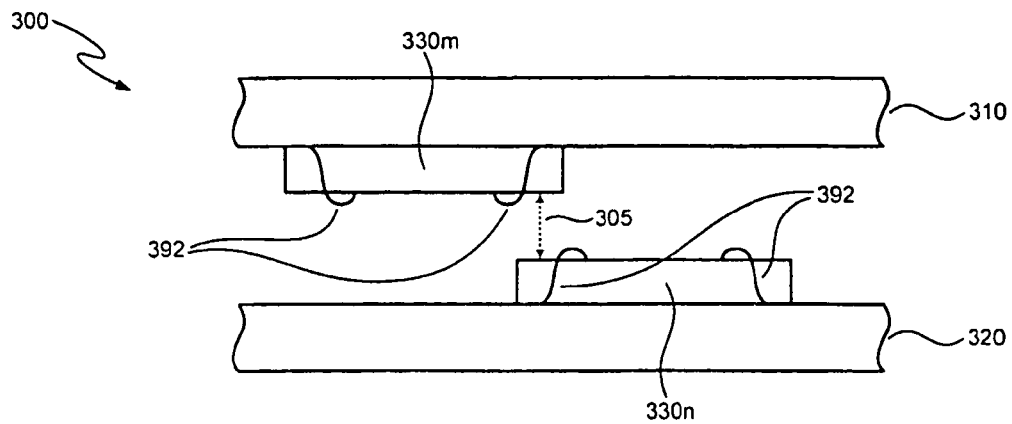
FIGS. 3A-3C are schematic diagrams illustrating additional embodiments of a multi-chip assembly having optically coupled die.
Figure 3B:
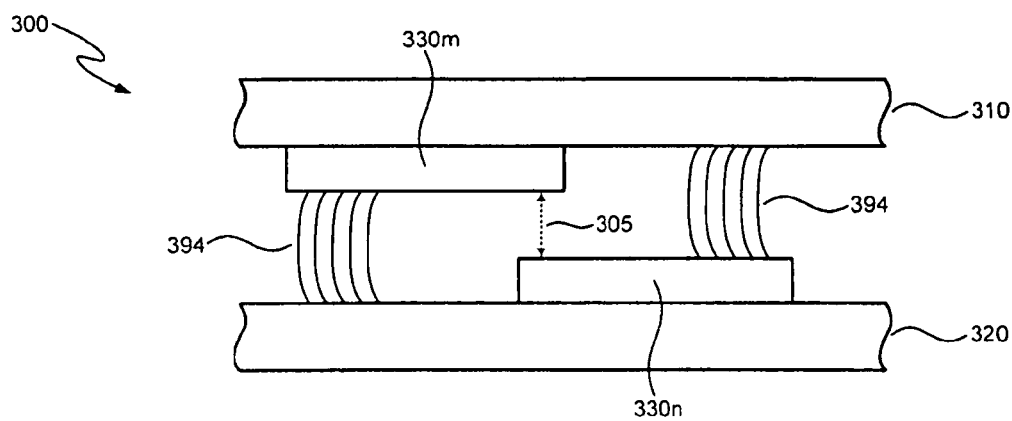
Figure 3C:
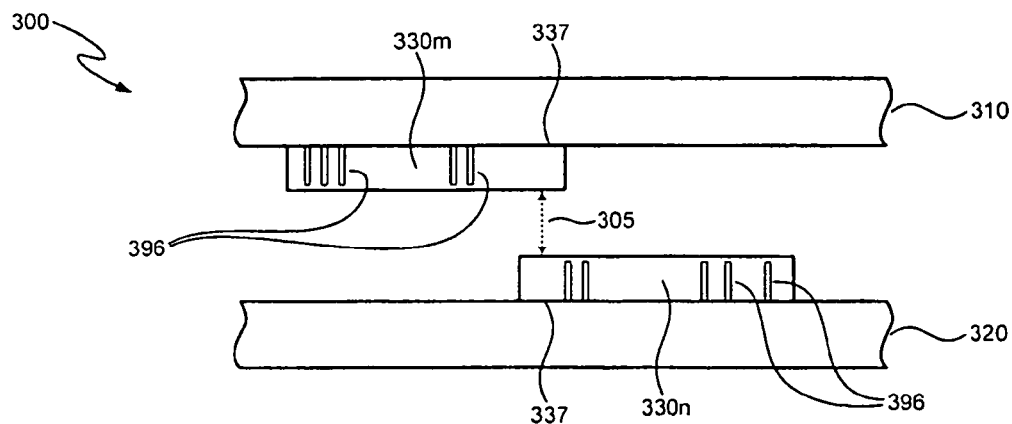

Illustrated in FIGS. 3A through 3C are various embodiments of the manner in which a die may be coupled to a substrate in a multi-chip package having optically coupled die. Referring first to FIG. 3A, illustrated is a portion of a multi-chip package 300, which includes a first substrate 310 and an opposing second substrate 320. The multi-chip package 300 includes at least two opposing die 330m, 330n on the substrates 310, 320, respectively, that are optically coupled, as described above (see arrow 305). To electrically couple each of the die 330m, 330n to that die's mating substrate 310, 320, respectively, a number of wirebonds 392 extend between each of these die and the mating substrate. A wirebond 392 may extend between a bond pad on one of the die 330m, 330n and a corresponding bond pad on a mating one of the substrate 310, 320. Also, each of the die 330m, 330n may be mechanically coupled to that die's mating substrate 310, 320, respectively, by a layer of adhesive.

Referring next to FIG. 3B, illustrated is another embodiment of the multi-chip package 300. The multi-chip package 300 of FIG. 3B is similar to that described above with respect to FIG. 3A; however, in the embodiment of FIG. 3B, each of the die 330m, 330n is coupled to one of the substrates 310, 320 by one or more compliant interconnects 394. For example, the die 330m is coupled to the opposing substrate 320 by a number of compliant interconnects 394, and the die 330n is coupled to this die's opposing substrate 310 by a number of compliant interconnects 394. A compliant interconnect 394 may extend between a bond pad on one of the die 330m, 330n and a corresponding bond pad on an opposing one of the substrates 310, 320. The interconnects 394 may comprise any suitable type of compliant interconnect, such as a micro-spring, a compliant bump or column, etc. Also, each of the die 330m, 330n may be mechanically coupled to that die's mating substrate 310, 320, respectively, by a layer of adhesive.

Turning now to FIG. 3C, illustrated is yet another embodiment of the multi-chip package 300. The multi-chip package 300 of FIG. 3C is also similar to that described above with respect to FIG. 3A. However, for the embodiment of FIG. 3C, one or more thru-vias 396 couple each of the die 330m, 330n with that die's underlying substrate 310, 320, respectively. Each thru-via extends from the backside 337 of a die 330 to conductors and/or circuitry on the die's opposing side. Further, in one embodiment, conductive bumps or columns (not shown in figure) may be employed to electrically couple a thru-via 396 to a bond pad on the underlying substrate (310 or 320), wherein an array of such conductive bumps may also serve to mechanically couple a die 330 to that die's mating substrate (310 or 320). The conductive bumps may comprise any suitable conductive material, such as solder, copper or a copper alloy, etc. Also, a layer of underfill or other adhesive may be disposed between the die and underlying substrate (and around the conductive bumps) to mechanically secure the die to the mating substrate.

Figure 4:
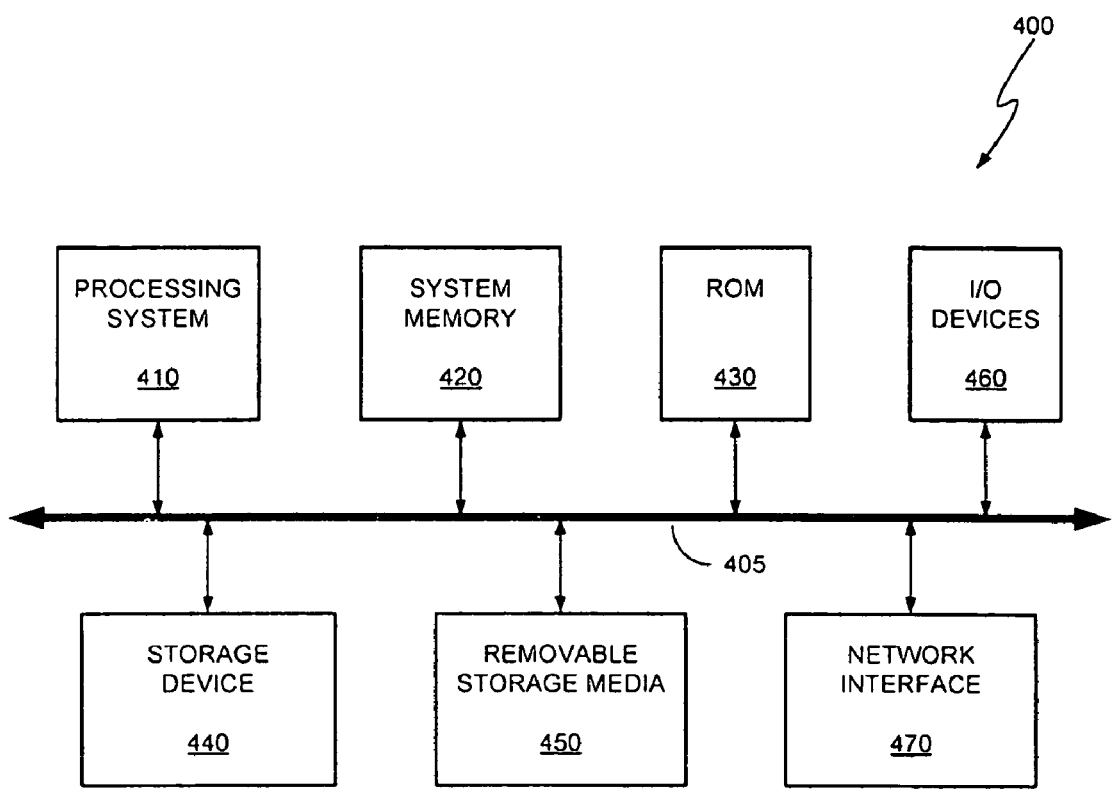
FIG. 4 is a schematic diagram illustrating an embodiment of a system which may include a multi-chip assembly having optically coupled die.

Referring to FIG. 4, illustrated is an embodiment of a computer system 400. Computer system 400 includes a bus 405 to which various components are coupled. Bus 405 is intended to represent a collection of one or more buses—e.g., a system bus, a Peripheral Component Interface (PCI) bus, a Small Computer System Interface (SCSI) bus, etc.—that interconnect the components of system 400. Representation of these buses as a single bus 405 is provided for ease of understanding, and it should be understood that the system 400 is not so limited. Those of ordinary skill in the art will appreciate that the computer system 400 may have any suitable bus architecture and may include any number and combination of buses.

Coupled with bus 405 is a processing system 410. The processing system 410 may comprise any suitable type and number of processing devices. For example, the processing system 410 may include one or more microprocessors, one or more network processors, one or more ASICs, and/or one or more FPGAs, as well as any combination of these and/or other devices. In one embodiment, the processing system 410 includes one or more memory devices. By way of example, the processing system 410 may include a SRAM, a DRAM, a SDRAM, and/or a DDRDRAM, as well as any combination of these and other memory devices (e.g., flash memory). According to one embodiment, the processing system 410 comprises a multi-chip assembly having optically coupled die, as described above. Also, it should be understood that, although FIG. 4 shows a single processing system 410, the computer system 400 may include two or more processing systems (each of which may comprise a multi-chip assembly, as described above).

Computer system 400 also includes system memory 420 coupled with bus 405, the system memory 420 comprising, for example, any suitable type and number of memories (e.g., SRAM, DRAM, SDRAM, and/or DDRDRAM, or any suitable combination of these and/or other memories). During operation of computer system 400, an operating system and other applications may be resident in the system memory 420.

The computer system 400 may further include a read-only memory (ROM) 430 coupled with the bus 405. The ROM 430 may store instructions for processing system 410. In other embodiments, the ROM 430 (or other program memory) may be integrated into processing system 410. The system 400 may also include a storage device (or devices) 440 coupled with the bus 405. The storage device 440 comprises any suitable non-volatile memory, such as, for example, a hard disk drive. The operating system and other programs may be stored in the storage device 440. Further, a device 450 for accessing removable storage media (e.g., a floppy disk drive or a CD ROM drive) may be coupled with bus 405.

The computer system 400 may also include one or more I/O (Input/Output) devices 460 coupled with the bus 405. Common input devices include keyboards, pointing devices such as a mouse, as well as other data entry devices, whereas common output devices include video displays, printing devices, and audio output devices. It will be appreciated that these are but a few examples of the types of I/O devices that may be coupled with the computer system 400.

The computer system 400 may further comprise a network interface 470 coupled with bus 405. The network interface 470 comprises any suitable hardware, software, or combination of hardware and software that is capable of coupling the system 400 with a network (e.g., a network interface card). The network interface 470 may establish a link with the network (or networks) over any suitable medium—e.g., wireless, copper wire, fiber optic, or a combination thereof—supporting the exchange of information via any suitable protocol—e.g., TCP/IP (Transmission Control Protocol/Internet Protocol), HTTP (Hyper-Text Transmission Protocol), as well as others.

It should be understood that the computer system 400 illustrated in FIG. 4 is intended to represent an exemplary embodiment of such a system and, further, that this system may include many additional components, which have been omitted for clarity and ease of understanding. By way of example, the system 400 may include a DMA (direct memory access) controller, a chip set associated with the processing system 410 (and perhaps integrated into the processing system 410), additional memory (e.g., a cache memory), as well as additional signal lines and buses. Also, it should be understood that the computer system 400 may not include all of the components shown in FIG. 4. The computer system 400 may comprise any type of computing device, such as a server, a desktop computer, a laptop computer, a hand-held computing device (e.g., a cell phone, a personal digital assistant, or PDA, etc.), a wireless communication device, an entertainment system, etc.

The foregoing detailed description and accompanying drawings are only illustrative and not restrictive. They have been provided primarily for a clear and comprehensive understanding of the disclosed embodiments and no unnecessary limitations are to be understood therefrom. Numerous additions, deletions, and modifications to the embodiments described herein, as well as alternative arrangements, may be devised by those skilled in the art without departing from the spirit of the disclosed embodiments and the scope of the appended claims.

What is claimed is:

1. An assembly comprising:
   a first substrate comprised of a first material;
   a first die mounted on the first substrate, the first die having an optical emitter and an optical receiver;
   a second substrate comprised of a second material, the second material different than the first material; and
   a second die mounted on the second substrate, the second die having an optical emitter and an optical receiver;
   wherein the optical emitter and receiver of the first die are optically coupled with the optical receiver and emitter, respectively, of the second die, the first die capable of transmitting signals to and receiving signals from the second die and the second die capable of transmitting signals to and receiving signals from the first die.

2. The assembly of claim 1, wherein the first material or the second material comprises silicon.

3. The assembly of claim 1, further comprising a thermal component coupled with one of the first and second substrates.

4. The assembly of claim 1, wherein at least one of the first die and the second die comprises a communications device.

5. The assembly of claim 1, further comprising:
   a third die mounted on the second substrate, the third die having an optical emitter and an optical receiver;
   wherein another optical emitter and another optical receiver on the first die are optically coupled with the optical receiver and emitter, respectively, of the third die, the first die capable of transmitting signals to and receiving signals from the third die and the third die capable of transmitting signals to and receiving signals from the first die.

* * * * *